United States Patent [19]
Aso et al.

[11] Patent Number: 5,712,047
[45] Date of Patent: Jan. 27, 1998

[54] COPPER FOIL FOR PRINTED WIRING BOARD

[75] Inventors: Kazuyoshi Aso; Masami Noguchi; Katsumi Kobayashi; Takeshi Yamagishi, all of Shimodate, Japan

[73] Assignee: Nippon Denkai, Ltd., Tokyo, Japan

[21] Appl. No.: 613,624

[22] Filed: Mar. 11, 1996

Related U.S. Application Data

[62] Division of Ser. No. 393,496, Feb. 24, 1995, Pat. No. 5,534,128.

[30] Foreign Application Priority Data

Feb. 24, 1994 [JP] Japan .................... 6-049972

[51] Int. Cl.$^6$ .................................... B32B 15/20
[52] U.S. Cl. .............. 428/607; 428/623; 428/632; 428/626; 428/658; 428/675; 428/935
[58] Field of Search .................... 428/606, 607, 428/626, 623, 632, 658, 675, 634, 935

[56] References Cited

U.S. PATENT DOCUMENTS

| | | |
|---|---|---|
| 4,010,005 | 3/1977 | Morisaki et al. .................... 29/195 |
| 4,356,067 | 10/1982 | McCoy .................... 204/43 |
| 4,417,956 | 11/1983 | McCoy .................... 204/44 |
| 4,537,837 | 8/1985 | Gunn et al. .................... 428/621 |
| 4,961,828 | 10/1990 | Lin et al. .................... 204/27 |
| 5,061,550 | 10/1991 | Shimizu et al. .................... 428/209 |
| 5,356,528 | 10/1994 | Fukuda et al. .................... 205/155 |

*Primary Examiner*—John J. Zimmerman
*Attorney, Agent, or Firm*—Antonelli, Terry, Stout, & Kraus, LLP

[57] ABSTRACT

A copper foil for a printed wiring board which has a carbon-containing copper-zinc coating comprising 40 to 90 atomic % of copper, 5 to 50 atomic % of zinc and 0.1 to 20 atomic % of carbon is produced by dipping a copper foil in a non-cyanide copper-zinc electroplating bath containing a copper salt, a zinc salt, a hydroxycarboxylic acid or a salt thereof, an aliphatic dicarboxylic acid or a salt thereof and a thiocyanic acid or a salt thereof, and carrying out electrolysis in the non-cyanide copper-zinc electroplating bath using the copper foil as a cathode to form on at least one surface of the copper foil a carbon-containing copper-zinc coating.

20 Claims, 1 Drawing Sheet

COPPER FOIL FOR PRINTED WIRING BOARD

CROSS-REFERENCE TO RELATED APPLICATIONS

This is a Divisional of application Ser. No. 08/393,496, filed Feb. 24, 1995, now U.S. Pat. No. 5,534,128, issued Jul. 9, 1996.

BACKGROUND OF THE INVENTION (a) Field of the Invention

The present invention relates to copper foil for printed wiring boards and to a method of surface treatment suitable for the production of the objective copper foil.

The present invention further relates to a non-cyanide copper-zinc electroplating bath which is suitably used for the surface treatment of copper foil for printed wiring boards.

(b) Description of the Related Art

As electronic parts to be mounted on printed wiring boards have been downsized, densified and improved in performance, the requirement for the quality of copper foil to be used as the material of conductor circuits is becoming more strict, requiring highly reliable properties.

The most basic property required is high bonding strength between copper foil and resinous base materials. In addition to ensuring high bonding strength just after the lamination of copper foil and resinous base materials by heating and pressing, maintaining the high bonding strength even after exposure to hard environmental conditions by, for example, dipping in chemicals, such as acids or alkalis, or heating, is the very important problem that should be solved for attaining high quality reliability.

A conventional means for solving the above-described problem is surface toughening of the bonding surface of copper foil to be bonded with resinous base materials, for example, by electrodeposition of copper particles on the surface of cathodic copper foil using a copper plating bath. Such a treatment gives copper foil an increased surface area, which conjointly with the anchoring effect of the copper particles, improves bonding strength remarkably.

However, the surface toughening alone cannot improve other bonding strength characteristics, such as chemical resistance or heat resistance, and the deterioration rate of bonding strength is too high to satisfy practical level.

To decrease the deterioration rate of bonding strength, various surface treatment layers are formed on the toughened surface. There have been proposed many surface treatments on the toughened surface of copper foil. For example, there were proposed a copper foil provided on its roughened surface with achromate coating [Japanese Patent Application Kokoku Koho (publication) No. 61-33908] and a copper foil provided on its roughened surface with a zinc coating and achromate coating in that order [Japanese Patent Application Kokoku Koho (publication) No. 61-33906]. These conventional copper foils improve some the above-described properties but, in some cases, adversely make adverse effects.

Particularly, the copper foil having achromate layer cannot sufficiently improve the bonding strength after a long-time heating. The copper foil provided with achromate layer on a zinc coating somewhat improves the bonding strength after heating, but causes a serious deterioration of the bonding strength after dipping in hydrochloric acid that is an essential chemical resistance, and the deterioration rate does not satisfy the practical level necessary for achieving high quality and high reliability.

In addition to the bonding strength characteristics, copper foil for printed wiring boards has stringent requirements for electrical characteristics. Considering that the width and gap of copper foil conductor circuits of printed wiring boards are becoming narrower and finer and resinous insulation layers are becoming thinner increasingly, excellence in migration resistance, which is a necessary electrical characteristic, is an essential condition.

For example, metal-base printed wiring boards the substrates of which are metal bases, such as an aluminum plate or an iron plate, a thin insulation layer, such as a resinous insulation layer, is interposed between the metal-bases and copper foil. In cases where such wiring boards are produced by using copper foil having the above-described conventional surface treatment layers, there occurs due partially to the thin insulation layer the disadvantage that migration makes rapid progress.

Migration is a phenomenon in which circuit copper foil is ionized and liquated in the presence of moisture or water by the potential difference between circuits or circuit layers of printed wiring boards and, as the time goes, the liquated copper ion is reduced to metal or compounds and grow in a dendritic form. When the growing branches reach other metallic material, there occurs a fatal defect in quality, namely a short circuit. That is the "short circuit due to copper ion migration".

To prevent such phenomenon, it is desirable, but almost impossible at present, to use a completely non-hygroscopic material for the polymeric insulating layer or base material that is laminated with copper foil or to make a condition free from the penetration of water.

There are proposed copper foils having copper alloy coating, which exhibit relatively good migration resistance. For example, a copper foil having on its surface a brass coating (copper-zinc alloy coating) is known [Japanese Patent Application Kokoku Koho (publication) No. 51-35711]. Although the copper foil virtually satisfies required properties, such as bonding strength, there is room for improvement. As to the migration resistance, the copper foil seems to be hopeless of improvement in insulation properties because the brass coating is a copper-zinc alloy containing copper as the main ingredient and no measure is taken to prevent the migration of copper ion. Further, the copper foil involves safety and sanitary problems in the characteristics and production of copper foil, such as the high risk of environmental pollution, since the brass coating is electrodeposited by using a plating bath containing cyanides.

In Japanese Patent Application Kokai Koho (laid-open) No. 59-50191 is disclosed another method of plating an alloy of copper and zinc on copper foil by using a plating bath, which however has the shortcoming that the plating bath is so unstable as to form precipitates.

SUMMARY OF THE INVENTION

An object of the present invention is to solve the problems of the above-described conventional arts and to provide a copper foil for printed wiring boards which maintains high bonding strength between copper foil and resinous base materials and is also excellent in migration resistance.

Another object of the present invention is to provide a method of surface treatment of copper foil for printed wiring boards which is suitable for the production of the above-described copper foil for printed wiring boards and is carried out without using virulently poisonous cyanides.

Another object of the present invention is to provide a non-cyanide copper-zinc electroplating bath which is very stable and suitable for the above-described method of the surface treatment of copper foil for printed wiring boards.

The inventors made researches to solve the problems of the above-described conventional arts and have completed the present invention.

That is, the present invention provides a copper foil for a printed wiring board comprising a copper foil and a carbon-containing copper-zinc coating on at least one surface of the copper foil, the carbon-containing copper-zinc coating comprising 40 to 90 atomic % of copper, 5 to 50 atomic % of zinc and 0.1 to 20 atomic % of carbon.

The present invention further provides a copper foil for a printed wiring board which further has on the carbon-containing copper-zinc coating a chromate-treatment coating on the carbon-containing copper-zinc coating, and further provides a copper foil for a printed wiring board which further has on the carbon-containing copper-zinc coating a chromate-treatment coating and a silane coupling agent coating in that order.

DESCRIPTION OF THE PREFERRED EMBODIMENTS

Figure 1:
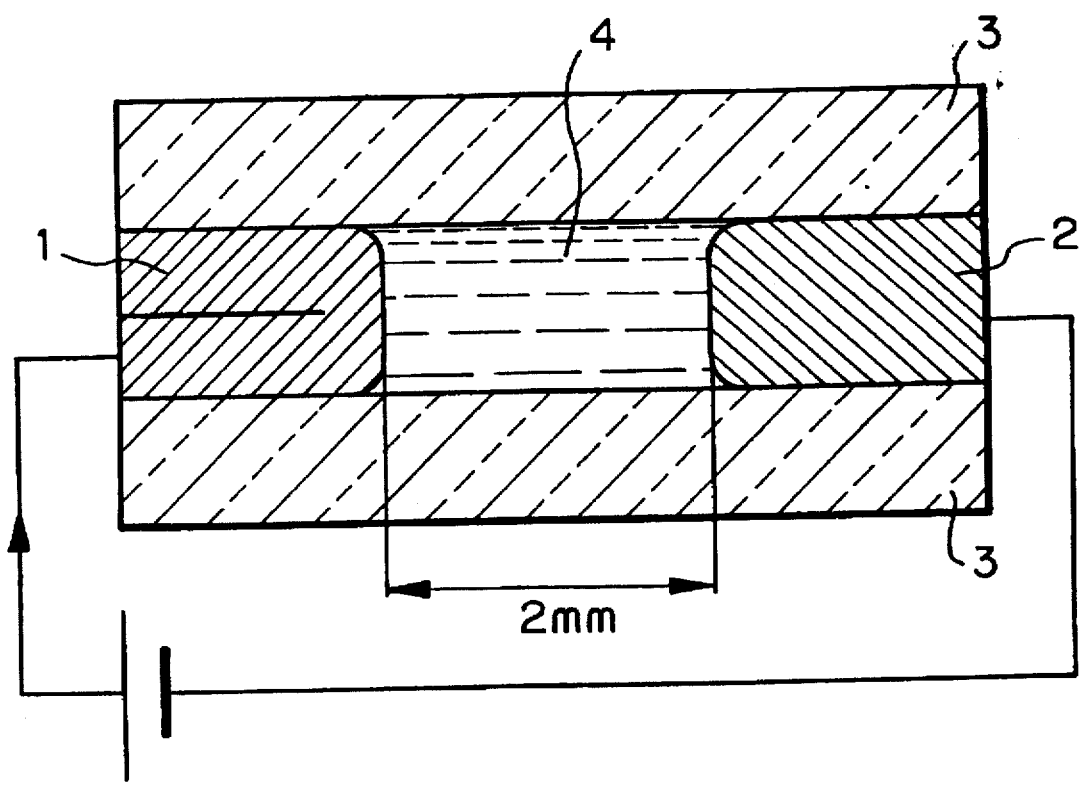
FIG. 1 is a sectional view illustrating the testing apparatus used for evaluating migration resistance.

The typical examples of the copper foil to be used in the present invention is an electrolytic copper foil or a rolled copper foil. Other examples includes composite foil produced by forming on the surfaces of an aluminum or plastic film a very thin copper layer of about 1 to 10 μm thick by electroplating, electroless plating, vacuum plating or spattering.

It is desirable to use a copper foil at least one surface of which has previously been toughened by an electrochemical means or mechanical means. Copper foil for printed wiring boards is heated and pressed with a resinous base material, which will be described later, to form a copper-clad laminate, and a copper foil having toughened surfaces improves the bonding strength between the copper foil and resinous base materials.

The thickness of the copper foil is not particularly limited and is generally 3 to 70 μm. Copper foil of more than 70 μm may also be used depending on its use, and the thickness may be selected to suit the use.

The copper foil for printed wiring boards of the present invention has on at least one surface a carbon-containing copper-zinc coating comprising the above-described ratios of copper, zinc and carbon. The carbon-containing copper-zinc coating is preferably a thin layer of such a thickness that the roughness of the toughened surface (mat surface) is not lost, that is, the roughened surface can exert its anchoring effect sufficiently to increase the bonding strength between the copper foil and a resinous base material. The preferred thickness ranges from 0.05 to 1.0 μm, more preferably 0.1 to 0.5 μm. The carbon-containing copper-zinc coating is so excellent in chemical resistance that even after dipping in an aqueous hydrochloric acid solution or an aqueous potassium cyanide solution, the decrease of bonding strength, namely the deterioration rate of bonding strength is held down effectively. The layer is as well so excellent in heat resistance as to prevent the decrease of bonding strength even after a long-term heating at high temperatures, and also in migration resistance.

The preferred contents of the elements contained in the carbon-containing copper-zinc coating are 45 to 70 atomic % of copper, 25 to 40 atomic % of zinc and 5 to 15 atomic % of carbon.

The action of each element is as follows. If the content of copper is less than 40 atomic %, resistance to hydrochloric acid will be lowered, and if it is more than 90 atomic %, migration resistance will be lowered. If the content of zinc is less than 5 atomic %, migration resistance will be lowered, and if it is more than 50 atomic %, the copper foil will go gray and resistance to hydrochloric acid will be lowered. If the content of carbon is less than 0.1 atomic %, migration resistance will be lowered, and if it is more than 20 atomic %, moisture resistant insulating properties may be deteriorated.

Herein, the atomic % of each of the three elements are determined by ESCA (Electron Spectroscopy for Chemical Analysis) using an X-ray photoelectron analyzer.

The present invention further provides a copper foil for printed wiring boards which further has on the carbon-containing copper-zinc coating a chromate-treatment coating, and further provides a copper foil for printed wiring boards which further has on the carbon-containing copper-zinc coating a chromate-treatment coating and a silane coupling agent coating in that order.

With respect to these copper foils for printed wiring boards, giving the chromate-treatment coating on the carbon-containing copper-zinc coating not only improves corrosion resistance and bonding strength but also decreases the deterioration rate of chemically resistant bonding strength after dipping in an alkali solution or acid solution. Giving the silane coupling agent coating on the chromate-treatment coating more improves bonding strength characteristics, so that the quality reliability of the copper foil for printed wiring boards is extremely improved.

The chromate-treatment coating comprises chromium oxide and chromium hydroxide and preferably contains 10 to 90 μg/dm$^2$, particularly preferably 30 to 70 μg/dm$^2$ of chromium as metallic chromium.

The silane coupling agent coating is preferably formed by applying a 0.001 to 5% by weight concentration aqueous solution of a silane coupling agent, which will be described later, followed by drying. From the viewpoint of improving the above-described bonding characteristics and cost, the particularly preferable concentration of the aqueous silane coupling agent solution is 0.01 to 3% by weight.

The method of surface treatment of copper foil for printed wiring boards of the present invention comprises dipping a copper foil in a non-cyanide copper-zinc electroplating bath which comprises an aqueous solution containing a copper salt, a zinc salt, a hydroxycarboxylic acid or a salt thereof, an aliphatic dicarboxylic acid or a salt thereof and a thiocyanic acid or a salt thereof, and carrying out electrolysis in the non-cyanide copper-zinc electroplating bath using the copper foil as a cathode to form on at least one surface of the copper foil a carbon-containing copper-zinc coating.

The present invention further provides a method of surface treatment of copper foil for printed wiring boards wherein a chromate-treatment coating is formed on the above-described carbon-containing copper-zinc coating by carrying out electrolysis in an aqueous solution containing hexavalent chromium ion using the copper foil having the carbon-containing copper-zinc coating as a cathode, and further provides a method of surface treatment of copper foil for printed wiring boards wherein a silane coupling agent coating is formed on the chromate-treatment coating.

Hereinafter, the methods of surface treatment of copper foil for printed wiring boards of the present invention will be described in detail. First the above-described material copper foil is subjected to surface roughening, according to demands. For example, a surface-toughened copper foil is prepared by dipping an electrolytic copper foil in a copper sulphate plating bath, a copper pyrophosphate plating bath, a copper sulfamate plating bath or a copper citrate plating bath, wherein electrolysis using the copper foil as a cathode is carried out to electrodeposit on at least one surface of the copper foil copper particles of a desired form, such as a dendritic form or a granular form. A carbon-containing copper-zinc coating is then formed on the toughened surface (mat surface) of the copper foil.

From the viewpoint of mass productivity and cost, it is practically advantageous to produce the copper foil for printed wiring boards of the present invention by the method of the present invention wherein the carbon-containing copper-zinc coating is formed by an electroplating method, particularly by a cathodic electrolysis.

According to the method of surface treatment of the present invention, the carbon-containing copper-zinc coating is electrodeposited by using the electroplating method. First a plating bath is prepared.

The non-cyanide copper-zinc electroplating bath to be used in the present invention preferably contains the copper salt in a concentration of 5 to 60 g/l, more preferably 10 to 30 g/l, the zinc salt in a concentration of 2 to 30 g/l, more preferably 5 to 15 g/l, the hydroxycarboxylic acid or the salt thereof in a concentration of 20 to 120 g/l, more preferably 30 to 90 g/l, the aliphatic dicarboxylic acid or the salt thereof in a concentration of 20 to 120 g/l, more preferably 30 to 60 g/l, and the thiocyanic acid or the salt thereof in a concentration of 1 to 20 g/l, more preferably 1 to 10 g/l.

The copper salt to be used may be any one which is known to be a copper ion source of plating baths. Some examples include copper pyrophosphate, copper sulfate, copper sulfamate, copper (II) acetate, basic copper carbonate, copper phosphate and copper (II) citrate.

The zinc salt to be used may be any one which is known to be a zinc ion source of plating bath. Some examples include zinc pyrophosphate, zinc sulfate, zinc chloride, zinc sulfamate, basic zinc carbonate, zinc oxalate and zinc lactate.

Some examples of the hydroxycarboxylic acid to be used include glycolic acid, lactic acid, malic acid, citric acid, gluconic acid, tartaric acid and glucoheptonic acid. Some examples of the salt of an hydroxycarboxylic acid to be used include sodium salts, potassium salts, lithium salts, copper salts and zinc salts of the above-described hydroxycarboxylic acids.

Some examples of the aliphatic dicarboxylic acid to be used include oxalic acid, malonic acid, succinic acid, maleic acid and fumaric acid. Some examples of the salt of an aliphatic dicarboxylic acid to be used include sodium salts, potassium salts, copper salts and zinc salts of the above-described aliphatic dicarboxylic acids.

Some examples of the thiocyanate to be used include sodium thiocyanate, potassium thiocyanate, copper thiocyanate and zinc thiocyanate.

These ingredients of each kind may be used individually or in combination of two or more.

These reagents are dissolved in a predetermined amount of water, and after adjustment of pH with, for example, sodium hydroxide or potassium hydroxide, the solution is used as the plating bath for electro-depositing the carbon-containing copper-zinc coating.

A copper foil is dipped in the thus prepared plating bath, wherein electrolysis using the copper foil as a cathode is carried out to form the carbon-containing copper-zinc coating. The preferred examples of the composition of the plating bath and of the electrolysis conditions are as follows. The particularly preferred ranges are designated in parentheses.

| Copper sulfate pentahydrate | 5–60 g/l (10–30 g/l) |
|---|---|
| Zinc sulfate heptahydrate | 2–30 g/l (5–15 g/l) |
| Sodium glucoheptonate | 20–120 g/l (30–90 g/l) |
| Potassium oxalate | 20–120 g/l (30–60 g/l) |
| Potassium thiocyanate | 1–20 g/l (1–10 g/l) |
| Bath temperature | 20–60° C. (20–50° C.) |
| pH | 9–14 (10–13) |
| Cathodic current density | 1–50 A/dm$^2$ (3–20 A/dm$^2$) |
| Electrolyzing time | 2–100 sec (5–50 sec) |
| Anode | iridium oxide-insoluble anode |
| Cathode | electrolytic copper foil or rolled copper foil |

It is important to maintain the contents of the elements in the carbon-containing copper-zinc coating within the above-described ranges. The contents of the elements in the carbon-containing copper-zinc coating are adjusted generally by properly regulating the concentrations of the reagents in the plating bath, cathodic current density, voltage, electrolyzing time, pH, bath temperature, agitation or the like. In mass-production, it is desirable to determine periodically the contents of the elements in the carbon-containing copper-zinc coating and the amounts of the ingredients in the plating bath, so that the ingredients in the plating bath are replenished and the electrolysis conditions are varied according to demands.

In a desired embodiment of the method of surface treatment for forming the carbon-containing copper-zinc coating, a copper foil of desired thickness and width is fed from a wound-up coil thereof, is then made to travel at a fixed speed in an apparatus for treating copper foil which comprises a degreasing bath, a pickling bath, a water washing bath, these three baths being arranged according to demands, a copper plating bath for surface toughening, a water washing bath, a plating bath for forming the carbon-containing copper-zinc coating, a water washing bath and a dryer, in that order, and is finally wound up continuously into a coil.

In the method of the present invention, after the formation of the carbon-containing copper-zinc coating and water washing, a chromate-treatment coating or a chromate-treatment coating and a silane coupling agent coating are formed on the carbon-containing copper-zinc coating.

Particularly, the chromate-treatment coating is formed by using an aqueous solution containing hexavalent chromium ion. Although chromate-treatment coating can be formed by dipping treatment alone, the preferred method is the cathodic electrolysis according to the present invention. The preferred examples of the composition of the plating bath and of the electrolysis conditions are as follows. The particularly preferred ranges are designated in parentheses.

| Sodium dichromate, Chromic acid or Potassium chromate | 0.1–50 g/l (1–5 g/l) |
|---|---|
| pH | 1–13 (3–12) |

| | |
|---|---|
| (adjusted with sulfuric acid or sodium hydroxide) | |
| Bath temperature | 0–60° C. (10–40° C.) |
| Cathodic current density | 0.1–50 A/dm² (0.2–5 A/dm²) |
| electrolyzing time | 0.1–100 sec (1–10 sec) |

After the formation of a chromate-treatment coating on the carbon-containing copper-zinc coating by the above-described procedure, drying is carried out to obtain the copper foil of the present invention.

According to another method of the present invention, following the drying, a silane coupling agent coating is further formed on the chromate-treatment coating. Some examples of the silane coupling agent to be used for the formation of the silane coupling agent coating are proposed and disclosed by us in Japanese Patent Application Kokoku Koho (publication) No. 60-15654 and include 3-aminopropyltriethoxysilane, 3-glycidoxypropyltrimethoxysilane, 3-mercaptopropyltrimethoxysilane and N-(2-aminoethyl)-3-aminopropylmethyldimethoxysilane. Among these, at least one silane coupling agent is used in a form an aqueous solution. The concentration of the silane coupling agent is generally 0.001 to 5% by weight, preferably 0.01 to 3 by weight. The aqueous solution is applied on the chromate-treatment coating, for example by spraying or dipping. After drying following the application, the copper foil of the present invention having a carbon-containing copper-zinc coating, a chromate-treatment coating and a silane coupling agent coating, in that order, is obtained.

The addition of the chromate-treatment coating alone or together with the silane coupling agent coating further improves the objective bonding strength characteristics more effectively. If desired, 0.1 to 10 g/l of other metal ions, such as zinc ion, molybdate ion, nickel ion or cobalt ion, may be added to the plating bath for forming the chromate-treatment coating, to form a chromate-treatment coating containing zinc, molybdenum or the like.

In the production of various copper-clad laminates, the copper foil obtained according to the present invention is used as the copper foil for printed wiring boards and is heat pressed with a resinous base material. Some examples of the resinous base material which may be used include a base material, such as paper, glass, glass cloth or glass woven cloth, impregnated with a thermosetting resin, such as an epoxy resin, a phenolic resin, a polyimide resin, an unsaturated polyester or a silicon resin, or a thermoplastic resin, such as a polyethylene, a saturated polyester or a polyethersulfone, polyimide-polyester film and those having a base of a metal plate, such as an aluminum or iron plate.

Hereinafter the present invention will be described in detail referring to Examples.

EXAMPLE 1

An electrolytic copper foil of 35 μm thick was dipped in a copper sulfate plating bath, wherein electrolysis using the copper foil as a cathode was carried out to roughen one surface of the copper foil by electrodeposition of granular copper. The copper foil was then dipped in a plating bath the composition of which is shown bellow and also in Table 1, wherein electrolysis using the surface-toughened copper foil was carried out under the electrolysis conditions of pH 11, bath temperature: 40° C., current density: 5 A/dm² and electrolyzing time: 15 sec, to form on the mat surface a carbon-containing copper-zinc coating.

| | |
|---|---|
| Copper sulfate pentahydrate | 20 g/l |
| Copper zinc heptahydrate | 8 g/l |
| Sodium glucoheptonate dihydrate | 50 g/l |
| Potassium thiocyanate | 5 g/l |
| Potassium oxalate | 30 g/l |

The copper foil was washed immediately with water, and was then dipped in an aqueous solution of 3.5 g/l of sodium dichromate ($Na_2Cr_2 \cdot 2H_2O$) which had been adjusted to pH 5.7 and to 26° C., wherein electrolysis using the copper foil as a cathode was carried out at a current density of 0.5 A/dm² for 5 seconds to form a chromate-treatment coating on the carbon-containing copper zinc coating. After the copper foil was washed with water sufficiently, to the chromate-treatment coating was sprayed a 0.15% by weight aqueous solution of 3-glycidoxypropyltrimethoxysilane (liquid temperature: 25° C.) and was then dried at 100° C. for 5 minutes, to obtain a copper foil of the present invention the mat surface of which was coated with the carbon-containing copper-zinc coating, the chromate-treatment coating and a silane coupling agent coating, in that order.

A test sample was cut from the obtained copper foil and was quantitatively analyzed with an ESCA analyzer to determine the elements contained in the carbon-containing copper-zinc coating. The results are as follows and as also listed in Table 1.

| | |
|---|---|
| Copper | 65 atomic % |
| Zinc | 27 atomic % |
| Carbon | 8 atomic % |

The conditions of the ESCA analysis were as follows.

Analyzer: ESCA-750 produced by Kabushiki Kaisha Shimazu Seisakusho
1. X-ray source: Mg-conical anode
2. Size of test sample: 6 mmφ
3. X-ray radiation area: the whole surface of the test sample
4. The degree of vacuum in the measuring cell: $5 \times 10^{-5}$ Pa. or less
5. X-ray output: 8 kV, 30 mA
6. Ion etching
   (1) Used gas: Ar gas, purity 99.999%
   (2) Argon gas pressure: $5 \times 10^{-4}$ Pa
   (3) Discharge current: 20 mA
   (4) Accelerating voltage: 2 kV
   (5) Ion current: 8–12 μV
   (6) Etching speed: 50–100 Å/min
   (7) Etching time: 300 sec The chromium metal content was determined with an ICP emission spectral analyzer to be 40 μg/dm².

The surface-treated copper foil was then laminated with an epoxy resin-impregnated glass base material of FR-4 grade at a temperature of 168° C. at a pressure of 38 kg/cm², to produce a copper-clad laminate.

The copper-clad laminate was subjected to the following tests, and the results are listed in Table 1.

1. Bonding strength test (peeling width: 1 mm, according to JIS C 6481)
   (1) A normal state . . . bonding strength A after lamination [a(kgf/cm)]
   (2) Degradation rate B after dipping in hydrochloric acid b(kgf/cm): boneing strength after dipping in 6 N aqueous hydrochloric acid solution (25° C.) for one hour Degradation rate B $(\%)=\{(a-b)/a\} \times 100$ (3) Degradation rate C after dipping in potassium cyanide c(kgf/cm): bonding strength after dipping in 10% aqueous potassium cyanide solution (70° C.) for 0.5 hour Degradation rate C $(\%)=\{(a-c)/a\} \times 100$ (4) Degradation rate D after heating d(kgf/cm): bonding strength after heating at 177° C. for 240 hours in a thermostat Degradation rate D $(\%)=\{(a-d)/a\} \times 100$ (5) Degradation rate E after boiling e(kgf/cm): bonding strength after boiling in water for two hours Degradation rate E $(\%)=\{(a-e)/a\} \times 100$ 2. The color G of copper foil Yellow copper foil results from uniform alloying and has excellent properties.

3. Test of migration resistance F

Migration resistance F was evaluated by using an apparatus as shown in FIG. 1, wherein a copper foil test sample 1 to be used as the anode was folded in two so that the coating on the mat surface treatment was exposed, and was opposed to a cathode made of an iron plate 2 with a space of 2 mm. After the anode and cathode were interposed between two glass sheets 3, the vacancy was filled with distilled water 4. A constant voltage (20 V) was then applied between the anode and cathode to measure the time F (sec) required for the current to be increased. The shorter time F indicates the faster progress of migration, which means a severe decrease in the insulation properties.

EXAMPLE 2

The same copper foil as that used in Example 1 was subjected to surface roughening in the same manner as in Example 1, and after formation of a carbon-containing copper zinc coating with the plating bath composition and electrolysis conditions that are listed in Table 1, the copper foil was washed with water and dried in the same manner as in Example 1. The obtained copper foil was subjected to measurements of the contents of elements and tests in the same manner as in Example 1. The results are listed in Table 1.

EXAMPLES 3, 7 AND 8

The same copper foil as that used in Example 1 was subjected to surface roughening in the same manner as in Example 1, and after formation of a carbon-containing copper-zinc coating with the plating bath composition and electrolysis conditions as listed in Table 1, the copper foil was washed with water. A chromate-treatment coating and a silane coupling agent coating were then formed thereon in the same manner as in Example 1. The obtained copper foil was subjected to measurements of the contents of elements and tests in the same manner as in Example 1. The results are listed in Table 1.

EXAMPLE 4

The same copper foil as that used in Example 1 was subjected to surface roughening in the same manner as in Example 1, and after formation of 8 carbon-containing copper-zinc coating with the plating bath composition and electrolysis conditions as in Table 1, the copper foil was washed with water. Following formation of a chromate-treatment coating in the same manner as in Example 1, washing with water and drying were carried out. The obtained copper foil was subjected to measurements of the contents of elements and tests in the same manner as in Example 1. The results are listed in Table 1.

EXAMPLES 5, 6 AND 9

The same copper foil as that used in Example 1 was subjected to surface roughening in the same manner as in Example 1, and after formation of a carbon-containing copper-zinc coating with the plating bath composition and electrolysis conditions as listed in Table 1, the copper foil was washed with water and dried in the same manner as in Example 1. The obtained copper foil was subjected to measurements of the contents of elements and tests in the same manner as in Example 1. The results are listed in Table 1.

COMPARATIVE EXAMPLES 1 AND 3

The same copper foil as that used in Example 1 was subjected to surface toughening in the same manner as in Example 1, and a carbon-containing copper-zinc coating was then formed employing the plating bath composition and electrolysis conditions as listed in Table 1. After washing with water, a chromate-treatment coating and a silane coupling agent coating were formed in the same manner as in Example 1. The obtained copper foil was subjected to measurements of the contents of elements and tests in the same manner as in Example 1. The results are listed in Table 2. The content of chromium metal was 40 µg/dm$^2$ as in Example 1.

COMPARATIVE EXAMPLES 2, 5, 6, 7 AND 8

The same copper foil as that used in Example 1 was subjected to surface toughening in the same manner as in Example 1, and after formation of a carbon-containing copper-zinc coating with the plating bath composition and electrolysis conditions as listed in Table 1, the copper foil was washed with water and dried in the same manner as in Example 1. The obtained copper foil was subjected to measurements of the contents of elements and tests in the same manner as in Example 1. The results are listed in Table 2.

COMPARATIVE EXAMPLE 4

The same copper foil as that used in Example 1 was subjected to surface roughening in the same manner as in Example 1, and after formation of a carbon-containing copper-zinc coating with the plating bath composition and electrolysis conditions that are listed in Table 1, the copper foil was washed with water. Following formation of a chromate-treatment coating in the same manner as in Example 1, washing with water and drying were carried out. The obtained copper foil was subjected to measurements of the contents of elements and tests in the same manner as in Example 1. The results are listed in Table 2.

COMPARATIVE EXAMPLE 9

The same copper foil as that used in Example 1 was subjected to surface roughening in the same manner as in Example 1, and was then subjected to cathodic electrolysis under the following conditions to form on the mat surface a copper-zinc alloy coating (approximate alloying ratios: copper 70, zinc 30), followed by washing with water.

| Plating bath composition | |
|---|---|
| Sodium cyanide | 50 g/l |
| Sodium hydroxide | 60 g/l |
| Copper cyanide | 90 g/l |
| Zinc cyanide | 5 g/l |
| Electrolysis conditions | |
| Current density | 5 A/dm$^2$ |
| pH | 12 |
| Temperature | 80° C. |
| Electrolyzing time | 15 sec |

The copper foil was then subjected sequentially to formation of a chromate-treatment coating, washing with water; formation of a silane coupling agent coating and drying in the same manner as in Example 1. The obtained copper foil was subjected to measurements of the contents of elements and tests in the same manner as in Example 1. The results are listed in Table 2.

COMPARATIVE EXAMPLE 10

The same copper foil as that used in Example 1 was subjected to surface toughening in the same manner as in Example 1, and was then subjected to cathodic electrolysis in a plating bath of a 3.5 g/l aqueous sodium dichromate (Na$_2$Cr$_2$O$_7$•2H$_2$) solution under the conditions of pH: 5.7, liquid temperature: 26° C., current density: 0.5 A/dm$^2$ and electrolyzing time: 5 sec, to form a chromate-treatment coating on the mat surface of the copper foil, followed by washing with water and drying. The obtained copper foil was subjected to measurements of the contents of elements and tests in the same manner as in Example 1. The results are listed in Table 2. The content of chromium metal was 40 µg/dm$^2$ as in Example 1.

COMPARATIVE EXAMPLE 11

The same copper foil as that used in Example 1 was subjected to surface roughening in the same manner as in Example 1, and was then subjected to cathodic electrolysis in a plating bath of a 3.5 g/l aqueous sodium dichromate (Na$_2$Cr$_2$O$_7$•2H$_2$O) solution under the conditions of pH: 5.7, liquid temperature: 26° C., current density: 0.5 A/dm$^2$ and electrolyzing time: 5 sec, to form a chromate-treatment coating on the mat surface of the copper foil. After washing with water, a 0.15% by weight aqueous solution of 3-glycidoxypropyltrimethoxysilane of 25° C. was showered on the chromate-treatment coating and was immediately dried at 100° C. for 5 minutes, to give a copper foil coated with the chromate-treatment coating and a silane coupling agent coating thereon. The obtained copper foil was subjected to measurements of the contents of elements and tests in the same manner as in Example 1. The results are listed in Table 2. The content of chromium metal was 40 µg/dm$^2$ as in Example 1.

TABLE 1

| | Composition of plating bath (g/l) | | | | | Electrolysis conditions | | | |
|---|---|---|---|---|---|---|---|---|---|
| Example No. | Copper sulfate pentahydrate | Zinc sulfate heptahydrate | Sodium glucoheptonate dihydrate | Potassium thiocyanate | Potassium oxalate | Current density (A/dm$^2$) | Electrolyzing time (sec) | pH | Bath Temp. (°C.) |
| 1 | 20 | 8 | 50 | 5 | 30 | 5 | 15 | 11 | 40 |
| 2 | 20 | 8 | 50 | 5 | 30 | 5 | 15 | 11 | 40 |
| 3 | 30 | 10 | 60 | 8 | 20 | 5 | 20 | 11 | 40 |
| 4 | 30 | 10 | 60 | 8 | 20 | 5 | 20 | 11 | 40 |
| 5 | 25 | 10 | 110 | 5 | 25 | 5 | 25 | 11 | 40 |
| 6 | 30 | 10 | 80 | 5 | 25 | 5 | 20 | 11 | 40 |
| 7 | 25 | 6 | 30 | 5 | 10 | 10 | 20 | 11 | 40 |
| 8 | 20 | 10 | 60 | 10 | 40 | 5 | 15 | 11 | 40 |
| 9 | 25 | 10 | 100 | 10 | 20 | 8 | 20 | 12 | 50 |

| Example No. | Elementary composition of coating (atomic %) | | | Results of tests of properties | | | | | | |
|---|---|---|---|---|---|---|---|---|---|---|
| | Copper | Zinc | Carbon | A (kgf/cm) | B (%) | C (%) | D (%) | E (%) | F (sec) | G |
| 1 | 65 | 27 | 8 | 1.98 | 2.7 | 6.0 | 51 | 8.5 | 440 | Yellow |
| 2 | 65 | 27 | 8 | 1.95 | 3.5 | 6.5 | 51 | 9.0 | 440 | Yellow |
| 3 | 61 | 31 | 8 | 2.00 | 2.9 | 5.8 | 50 | 8.1 | 410 | Yellow |
| 4 | 61 | 31 | 8 | 1.96 | 3.8 | 6.0 | 50 | 10.0 | 410 | Yellow |
| 5 | 48 | 39 | 13 | 1.95 | 4.5 | 5.5 | 53 | 8.5 | 400 | Yellow |
| 6 | 58 | 33 | 9 | 1.98 | 3.0 | 5.8 | 51 | 9.0 | 450 | Yellow |
| 7 | 70 | 25 | 5 | 2.00 | 2.5 | 5.9 | 48 | 8.1 | 390 | Yellow |
| 8 | 59 | 30 | 11 | 2.04 | 3.0 | 6.0 | 50 | 8.0 | 440 | Yellow |
| 9 | 54 | 36 | 10 | 1.93 | 3.5 | 6.0 | 52 | 8.0 | 450 | Yellow |

TABLE 2

| Comp. Example No. | Composition of plating bath (g/l) | | | | | Electrolysis conditions | | | |
|---|---|---|---|---|---|---|---|---|---|
| | Copper sulfate pentahydrate | Zinc sulfate heptahydrate | Sodium glucoheptonate dihydrate | Potassium thiocyanate | Potassium oxalate | Current density (A/dm$^2$) | Electrolyzing time (sec) | pH | Bath Temp. (°C.) |
| 1 | 3 | 10 | 60 | 10 | 40 | 5 | 20 | 11 | 40 |
| 2 | 3 | 10 | 60 | 10 | 40 | 5 | 20 | 11 | 40 |
| 3 | 20 | 40 | 120 | 10 | 40 | 5 | 20 | 11 | 40 |
| 4 | 20 | 40 | 120 | 10 | 40 | 5 | 20 | 11 | 40 |
| 5 | 20 | 10 | 60 | 0 | 30 | 5 | 20 | 11 | 40 |
| 6 | 20 | 10 | 60 | 5 | 0 | 5 | 20 | 11 | 40 |
| 7 | 20 | 10 | 20 | 5 | 30 | 5 | 20 | 11 | 40 |
| 8 | 20 | 10 | 45 | 0 | 0 | 5 | 20 | 11 | 40 |
| 9 | Formation of cyanide - type copper - zinc coating | | | | | 5 | 15 | 12 | 80 |
| 10 | Formation of chromate - treatment coating | | | | | | | | |
| 11 | Formation of chromate - treatment coating and silane coupling agent coating thereon | | | | | | | | |

| Comp. Example No. | Elementary composition of coating (atomic %) | | | Results of tests of properties | | | | | | |
|---|---|---|---|---|---|---|---|---|---|---|
| | Copper | Zinc | Carbon | A (kgf/cm) | B (%) | C (%) | D (%) | E (%) | F (sec) | G |
| 1 | 51 | 39 | 10 | 1.98 | 20.0 | 6.5 | 52 | 9.5 | 220 | Gray |
| 2 | 51 | 39 | 10 | 1.95 | 21.2 | 7.0 | 58 | 28.2 | 220 | Gray |
| 3 | 38 | 50 | 12 | 1.98 | 26.8 | 5.3 | 53 | 10.1 | 260 | Light brown |
| 4 | 38 | 50 | 12 | 1.95 | 27.5 | 7.1 | 56 | 24.2 | 260 | Light brown |
| 5 | 64 | 28 | 8 | 2.00 | 18.0 | 5.5 | 62 | 29.3 | 200 | Brown |
| 6 | 71 | 26 | 3 | 2.02 | 15 | 6.0 | 58 | 29.0 | 250 | Dark green |
| 7 | 67 | 28 | 5 | 2.06 | 21.4 | 4.8 | 53 | 28.5 | 200 | Dark green |
| 8 | 70 | 25 | 5 | 1.96 | 13.5 | 8.9 | 59 | 28.6 | 280 | Dark green* |
| 9 | 71 | 29 | 0 | 1.98 | 4.0 | 6.0 | 53 | 10.2 | 250 | Yellow |
| 10 | — | — | — | 1.95 | 3.0 | 6.0 | 98.0 | 31.5 | 80 | Red |
| 11 | — | — | — | 2.00 | 1.9 | 6.0 | 96.8 | 9.8 | 80 | Red |

A: Bonding strength after lamination
B: Deterioration rate after dipping in hydrochloric acid
C: Deterioration rate after dipping in potassium cyanide
D: Deterioration rate after heating
E: Deterioration rate after boiling
F: Migration resistance
G: Color of copper foil
*: Precipitation The present invention is typically exemplified by the copper foils on which only a carbon-containing copper-zinc coating was formed (Examples 2, 5, 6 and 9), the copper foils on which a carbon-containing copper-zinc coating and a chromate-treatment coating were formed in that order (Examples 4) and the copper foils on which a carbon-containing copper-zinc coating, a chromate-treatment coating and a silane coupling agent coating were formed in that order (Examples 1, 3, 7 and 8). In Examples 2, 5, 6 and 9, the bonding strength under normal conditions was somewhat lower than that attained in other Examples, but reached the practical level. Further, the deterioration rates after dipping in an aqueous hydrochloric acid solution and dipping in an aqueous potassium cyanide solution were as well decreased as in other Examples. Further, the laminates produced in Examples were excellent in migration resistance, which is an electrical property, indicating the ability of long-term prevention of the deterioration in insulation due to migration of copper ion. Because of these excellent properties, the copper foil for printed wiring boards of the present invention stands use under severe conditions, such as high temperatures and high humidity, to maintain high quality reliability.

On the other hand, Comparative Examples 1 to 11 show that all the required different properties as listed in tables cannot be satisfied at the same time by copper foil treated in plating baths different in compositions or concentrations from that of the present invention nor by copper foil coated with a copper-zinc binary alloy layer according to conventional methods.

As described above, the copper foil for printed wiring boards of the present invention is very useful for the production of copper-clad laminates since when laminated with resinous base materials, the copper foil because of the carbon-containing copper-zinc coating thereon is bonded strongly with resinous base materials and also maintains the high bonding strength even under severe conditions made by, for example, heating or chemical reagents. The copper foil for printed wiring boards of the present invention is also excellent in migration resistance and contributes to the improvement of the insulation properties of printed wiring boards.

The chromate-treatment coating or the chromate-treatment coating and the silane coupling agent coating on the carbon-containing copper-zinc coating further improve the bonding properties in heat resistance and chemical resistance.

As printed wiring boards are increasingly multi-layered and made denser and finer, the copper foil of the present invention that satisfies the properties required of copper foil for printed wiring boards, such as heat resistance, chemical resistance and migration resistance, is suitably used as a copper foil for internal or surface wiring of various printed wiring boards.

The method of surface treatment of copper foil of the present invention using no cyanides is excellent in safety, and the non-cyanide copper-zinc electroplating bath of the present invention is excellent in stability, so that both are suitably applicable for the production of the copper foil for printed wiring boards of the present invention.

What is claimed:

1. A copper foil for a printed wiring board comprising a copper foil and a carbon-containing copper-zinc coating on at least one surface of the copper foil, the carbon-containing copper-zinc coating comprising 40 to 90 atomic % of copper, 5 to 50 atomic % of zinc and 0.1 to 20 atomic % of carbon, the carbon-containing copper-zinc coating being deposited from a plating solution containing a hydroxycarboxylic acid or a salt thereof and an aliphatic dicarboxylic acid or a salt thereof in aqueous solution.

2. A copper foil for a printed wiring board comprising a copper foil, a carbon-containing copper-zinc coating on at least one surface of the copper foil, and a chromate-treatment coating on the carbon-containing copper-zinc coating, the carbon-containing copper-zinc coating comprising 40 to 90 atomic % of copper, 5 to 50 atomic % of zinc and 0.1 to 20 atomic % of carbon, the carbon-containing copper-zinc coating being deposited from a plating solution containing a hydroxycarboxylic acid or a salt thereof and an aliphatic dicarboxylic acid or a salt thereof in aqueous solution.

3. A copper foil for a printed wiring board comprising a copper foil, a carbon-containing copper-zinc coating on at least one surface of the copper foil, a chromate-treatment coating on the carbon-containing copper-zinc coating, and a silane coupling agent coating on the chromate-treatment coating, the carbon-containing copper-zinc coating comprising 40 to 90 atomic % of copper, 5 to 50 atomic of zinc and 0.1 to 20 atomic % of carbon, the carbon-containing copper-zinc coating being deposited from a plating solution containing a hydroxycarboxylic acid or a salt thereof and an aliphatic dicarboxylic acid or a salt thereof in aqueous solution.

4. The copper foil of claim 1, wherein the carbon-containing copper-zinc coating is a coating formed by dipping the copper foil in a non-cyanide copper-zinc electroplating bath which comprises an aqueous solution containing a copper salt, a zinc salt, a hydroxycarboxylic acid or a salt thereof, an aliphatic dicarboxylic acid or a salt thereof, and a thiocyanic acid or a salt thereof, and carrying out electrolysis in the non-cyanide copper-zinc electroplating bath using the copper foil as a cathode.

5. The copper foil of claim 1, wherein the at least one surface of the copper foil, on which the carbon-containing copper-zinc coating is provided, is a toughened surface, roughened by electrochemical or mechanical means.

6. The copper foil of claim 1, wherein the carbon-containing copper-zinc coating has a thickness of 0.05–1.0 μm.

7. The copper foil of claim 6, wherein the carbon-containing copper-zinc coating comprises 45 to 70 atomic % of copper, 25 to 40 atomic % of zinc and 5 to 15 atomic % of carbon.

8. The copper foil of claim 1, wherein the carbon-containing copper-zinc coating comprises 45 to 70 atomic % of copper, 25 to 40 atomic % of zinc and 5 to 15 atomic % of carbon.

9. The copper foil of claim 1, wherein the hydroxycarboxylic acid and salts thereof are selected from the group consisting of glycolic acid, lactic acid, malic acid, citric acid, gluconic acid, tartaric acid and glucoheptonic acid, and sodium salts, potassium salts, lithium salts, copper salts and zinc salts thereof.

10. The copper foil of claim 9, wherein the aliphatic dicarboxylic acid and salts thereof are selected from the group consisting of oxalic acid, malonic acid, succinic acid, maleic acid and fumaric acid, and sodium salts, potassium salts, copper salts and zinc salts thereof.

11. The copper foil of claim 2, wherein the carbon-containing copper-zinc coating is a coating formed by dipping the copper foil in a non-cyanide copper-zinc electroplating bath which comprises an aqueous solution containing a copper salt, a zinc salt, a hydroxycarboxylic acid or a salt thereof, an aliphatic dicarboxylic acid or a salt thereof, and a thiocyanic acid or a salt thereof, and carrying out electrolysis in the non-cyanide copper-zinc electroplating bath using the copper foil as a cathode.

12. The copper foil of claim 2, wherein the carbon-containing copper-zinc coating has a thickness of 0.05–1.0 μm.

13. The copper foil of claim 12, wherein the carbon-containing copper-zinc coating comprises 45 to 70 atomic % of copper, 25 to 40 atomic % of zinc and 5 to 15 atomic % of carbon.

14. The copper foil of claim 2, wherein the carbon-containing copper-zinc coating comprises 45 to 70 atomic % of copper, 25 to 40 atomic % of zinc and 5 to 15 atomic % of carbon.

15. The copper foil of claim 2, wherein the chromate-treatment coating contains 10–90 μg/dm$^2$ of chromium.

16. The copper foil of claim 3, wherein the carbon-containing copper-zinc coating is a coating formed by dipping the copper foil in a non-cyanide copper-zinc electroplating bath which comprises an aqueous solution containing a copper salt, a zinc salt, a hydroxycarboxylic acid or a salt thereof, an aliphatic dicarboxylic acid or a salt thereof, and a thiocyanic acid or a salt thereof, and carrying out electrolysis in the non-cyanide copper-zinc electroplating bath using the copper foil as a cathode.

17. The copper foil of claim 3, wherein the carbon-containing copper-zinc coating has a thickness of 0.05–1.0 μm.

18. The copper foil of claim 17, wherein the carbon-containing copper-zinc coating comprises 45 to 70 atomic % of copper, 25 to 40 atomic % of zinc and 5 to 15 atomic % of carbon.

19. The copper foil of claim 3, wherein the carbon-containing copper-zinc coating comprises 45 to 70 atomic % of copper, 25 to 40 atomic % of zinc and 5 to 15 atomic % of carbon.

20. The copper foil of claim 3, wherein the silane coupling agent coating is a coating formed by applying an aqueous solution having a concentration of 0.001 to 5% by weight silane coupling agent.

* * * * *